United States Patent
Abas

(10) Patent No.: US 10,720,351 B2
(45) Date of Patent: *Jul. 21, 2020

(54) BOWING SEMICONDUCTOR WAFERS

(71) Applicant: SunPower Corporation, San Jose, CA (US)

(72) Inventor: Emmanuel Chua Abas, Santa Rosa (PH)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/119,776

(22) Filed: Aug. 31, 2018

(65) Prior Publication Data

US 2018/0374730 A1    Dec. 27, 2018

Related U.S. Application Data

(63) Continuation of application No. 15/395,955, filed on Dec. 30, 2016, now Pat. No. 10,068,787.

(51) Int. Cl.
*H01L 21/673* (2006.01)
*H01L 31/18* (2006.01)
*H01L 31/0368* (2006.01)

(52) U.S. Cl.
CPC .. *H01L 21/67316* (2013.01); *H01L 21/67313* (2013.01); *H01L 21/67326* (2013.01);
(Continued)

(58) Field of Classification Search
CPC .......... H01L 21/67316; H01L 21/0368; H01L 21/67313; H01L 21/67326; H01L 21/6733;
(Continued)

(56) References Cited

U.S. PATENT DOCUMENTS 3,889,815 A * 6/1975 Merle ........................ A47F 7/02
                                                             211/41.1
3,949,891 A    4/1976 Butler et al.
(Continued)

FOREIGN PATENT DOCUMENTS

WO    WO-2014106190 A2 *  7/2014 ............. C30B 25/12
WO    WO 2015/180798 A1    12/2015

OTHER PUBLICATIONS

Notice of Allowance and Fee(s) Due and Applicant-Initiated Interview Summary for U.S. Appl. No. 15/395,955, filed May 4, 2018.
(Continued)

*Primary Examiner* — Jennifer E. Novosad
(74) *Attorney, Agent, or Firm* — Jenkins, Wilson, Taylor & Hunt, P.A.

(57) ABSTRACT

This specification describes methods for processing semiconductor wafers, methods for loading semiconductor wafers into wafer carriers, and semiconductor wafer carriers. The methods and wafer carriers can be used for increasing the rigidity of wafers, e.g., large and thin wafers, by intentionally bowing the wafers to an extent that does not break the wafers. In some examples, a method for processing semiconductor wafers includes loading each semiconductor wafer into a respective semiconductor wafer slot of a semiconductor wafer carrier, horizontally bowing each semiconductor wafer, and moving the semiconductor wafer carrier into a processing station and processing the semiconductor wafers at the processing station while the semiconductor wafers are loaded into the semiconductor wafer carrier and horizontally bowed.

20 Claims, 5 Drawing Sheets

(52) U.S. Cl.
CPC .......... *H01L 31/18* (2013.01); *H01L 31/0368* (2013.01); *Y02E 10/50* (2013.01); *Y02P 70/521* (2015.11)

(58) Field of Classification Search
CPC ............. H01L 21/673; H01L 21/68771; H01L 21/67346; H01L 21/67363; H01L 21/67383; H01L 21/6735; H01L 21/68757; H01L 21/68735; H01L 31/18; H01L 31/0368; A47B 65/10; A47B 45/00; A47B 57/58; A47B 57/583; A47B 65/00; A47B 65/15; A47B 65/20; A47F 7/144; B25B 11/00; B25B 11/02; Y02P 70/521; Y02E 10/50
USPC ......... 211/1.18, 43; 206/833, 710, 711, 832, 206/454; 414/935–941; 269/266, 903, 269/289 R
See application file for complete search history.

(56) References Cited

U.S. PATENT DOCUMENTS

| | | | |
|---|---|---|---|
| 4,388,140 A * | 6/1983 | Nakazato | H01L 21/67086 156/345.23 |
| 4,427,114 A * | 1/1984 | Howell | H05K 9/0067 206/454 |
| 4,471,716 A | 9/1984 | Milliren | |
| 4,515,104 A * | 5/1985 | Lee | B05C 13/02 118/500 |
| 4,566,839 A | 1/1986 | Butler | |
| 4,572,101 A * | 2/1986 | Lee | B05C 13/02 118/500 |
| 4,573,851 A * | 3/1986 | Butler | H01L 21/67313 206/832 |
| 4,872,554 A * | 10/1989 | Quernemoen | C30B 31/10 206/454 |
| 4,981,222 A * | 1/1991 | Lee | C23C 16/4587 118/500 |
| 4,993,559 A * | 2/1991 | Cota | H01L 21/67313 211/41.18 |
| 5,117,984 A * | 6/1992 | Kennedy | G11B 33/0483 211/40 |
| 5,461,774 A * | 10/1995 | Holmes | H01L 21/4878 174/16.3 |
| 5,503,173 A * | 4/1996 | Kudo | H01L 21/67057 134/201 |
| 5,657,879 A * | 8/1997 | Anderson | H01L 21/67313 211/41.18 |
| 5,788,304 A * | 8/1998 | Korn | H01L 21/67316 118/500 |
| 5,908,042 A * | 6/1999 | Fukunaga | B08B 11/02 134/25.1 |
| 6,089,377 A * | 7/2000 | Shimizu | H01L 21/67313 206/711 |
| 6,308,839 B1 * | 10/2001 | Steinberg | G11B 23/0236 211/184 |
| 6,384,487 B1 * | 5/2002 | Smith | H01L 21/565 257/666 |
| 6,561,796 B1 * | 5/2003 | Barrera | C23C 16/46 118/50 |
| 6,648,150 B2 * | 11/2003 | Hartstone | G11B 33/0461 211/11 |
| 7,868,467 B2 * | 1/2011 | Lee | H01L 21/823412 257/780 |
| 7,994,595 B2 * | 8/2011 | Forbes | H01L 21/76254 257/288 |
| 8,221,600 B2 | 3/2012 | Ganti | |
| 8,221,601 B2 | 3/2012 | Chen et al. | |
| 8,317,987 B2 | 11/2012 | Abas et al. | |
| 8,322,300 B2 | 12/2012 | Pavani et al. | |
| 8,449,238 B2 | 5/2013 | Mulligan et al. | |
| 8,557,093 B2 | 10/2013 | Cousins et al. | |
| 9,048,245 B2 * | 6/2015 | Blackshear | H01L 23/562 |
| 9,059,240 B2 * | 6/2015 | Blackshear | H01L 24/75 |
| 9,465,049 B2 * | 10/2016 | Colvin | G01R 1/44 |
| 9,556,512 B2 | 1/2017 | Cousins et al. | |
| 9,583,364 B2 * | 2/2017 | Falster | H01L 21/302 |
| 9,824,894 B2 * | 11/2017 | deVilliers | H01L 22/20 |
| 10,068,787 B2 * | 9/2018 | Abas | H01L 21/67313 |
| 10,361,097 B2 * | 7/2019 | Falster | H01L 21/302 |
| 2002/0023590 A1 * | 2/2002 | Storbeck | H01L 21/68735 118/725 |
| 2003/0056391 A1 * | 3/2003 | Shikami | H01L 21/67034 34/92 |
| 2004/0137737 A1 * | 7/2004 | Seo | H01L 21/2815 438/690 |
| 2004/0163988 A1 | 8/2004 | Yamada et al. | |
| 2004/0219780 A1 * | 11/2004 | Ohuchi | H01L 21/3085 438/637 |
| 2004/0226506 A1 * | 11/2004 | Lynn | H01L 21/67057 118/500 |
| 2004/0262245 A1 * | 12/2004 | Niese | H01L 21/67313 211/41.18 |
| 2005/0051083 A1 * | 3/2005 | Ruiz | H01L 21/67316 118/58 |
| 2005/0189616 A1 * | 9/2005 | Brennan | H01L 29/0657 257/550 |
| 2006/0286769 A1 | 12/2006 | Tsuchiya et al. | |
| 2007/0034252 A1 * | 2/2007 | Pellegrin | H01L 21/6734 136/256 |
| 2007/0123031 A1 * | 5/2007 | Isogai | H01L 28/91 438/624 |
| 2007/0125726 A1 * | 6/2007 | Seo | H01L 21/67028 211/41.18 |
| 2009/0084169 A1 * | 4/2009 | Bailey, III | H01L 22/20 73/104 |
| 2010/0078867 A1 * | 4/2010 | Nakashima | H01L 21/67057 269/303 |
| 2011/0062053 A1 * | 3/2011 | Vo | H01L 21/67313 206/722 |
| 2011/0064953 A1 * | 3/2011 | O'Rourke | H01L 29/78603 428/414 |
| 2011/0100937 A1 | 5/2011 | Mohamed | |
| 2012/0021552 A1 * | 1/2012 | Alexander | H01L 21/67109 438/57 |
| 2012/0074523 A1 * | 3/2012 | Goldstein | C30B 23/025 257/607 |
| 2012/0225554 A1 * | 9/2012 | Yoon | H01L 21/76802 438/675 |
| 2014/0045411 A1 * | 2/2014 | Senderzon | H01L 21/67092 451/41 |
| 2014/0187023 A1 * | 7/2014 | Falster | H01L 21/302 438/476 |
| 2014/0209666 A1 * | 7/2014 | Interrante | H01L 248/75 228/180.1 |
| 2014/0225231 A1 * | 8/2014 | Gambino | H01L 23/562 257/629 |
| 2014/0379282 A1 * | 12/2014 | Inaba | G01N 23/20 702/42 |
| 2015/0056805 A1 * | 2/2015 | Park | H01L 21/76804 438/672 |
| 2015/0137259 A1 * | 5/2015 | Han | H01L 29/4175 257/384 |
| 2015/0155196 A1 | 6/2015 | Wu et al. | |
| 2015/0294917 A1 * | 10/2015 | deVilliers | H01L 22/20 438/7 |
| 2015/0371909 A1 * | 12/2015 | Bhagavat | H01L 22/12 438/5 |
| 2016/0315003 A1 * | 10/2016 | Reichart | H01L 21/67313 |
| 2016/0322253 A1 * | 11/2016 | Yen | H01L 21/67313 |
| 2018/0190525 A1 | 7/2018 | Abas | |

OTHER PUBLICATIONS

Notification of Transmittal of the International Search Report and the Written Opinion of the International Searching Authority, or the Declaration for International Application No. PCT/US2017/067012 (dated Apr. 6, 2018).

(56) References Cited

OTHER PUBLICATIONS

Non-Final Office Action for U.S. Appl. No. 15/395,955, filed Jan. 2, 2018.
Restriction and/or Election Requirement for U.S. Appl. No. 15/395,955, filed Oct. 6, 2017.

* cited by examiner

BOWING SEMICONDUCTOR WAFERS

TECHNICAL FIELD

The subject matter described in this specification relates generally to manufacturing solar cells and other semiconductor structures by bowing semiconductor wafers.

PRIORITY CLAIM

This application is a continuation of U.S. patent application Ser. No. 15/395,955, filed Dec. 30, 2016, the disclosure of which is incorporated herein by reference in its entirety.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit. Manufacturing solar cells and other semiconductor structures typically involves loading semiconductor wafers into a wafer carrier for one or more of various semiconductor processing stages.

DETAILED DESCRIPTION

This specification describes methods for processing semiconductor wafers, methods for loading semiconductor wafers into wafer carriers, and semiconductor wafer carriers. The methods and wafer carriers can be used for increasing the rigidity of wafers, e.g., large and thin wafers, by intentionally bowing the wafers to an extent that does not break the wafers. The wafers can be bowed after loading, i.e., within the wafer carrier, or prior to loading, i.e., so that the wafers are loaded so that the remain bowed when loaded. In some examples, the wafers are partially loaded, then bowed, and then fully inserted. In some examples, a method for processing semiconductor wafers includes loading each semiconductor wafer into a respective semiconductor wafer slot of a semiconductor wafer carrier, horizontally bowing each semiconductor wafer, and moving the semiconductor wafer carrier into a processing station and processing the semiconductor wafers at the processing station while the semiconductor wafers are loaded into the semiconductor wafer carrier and horizontally bowed.

Figure 1A:
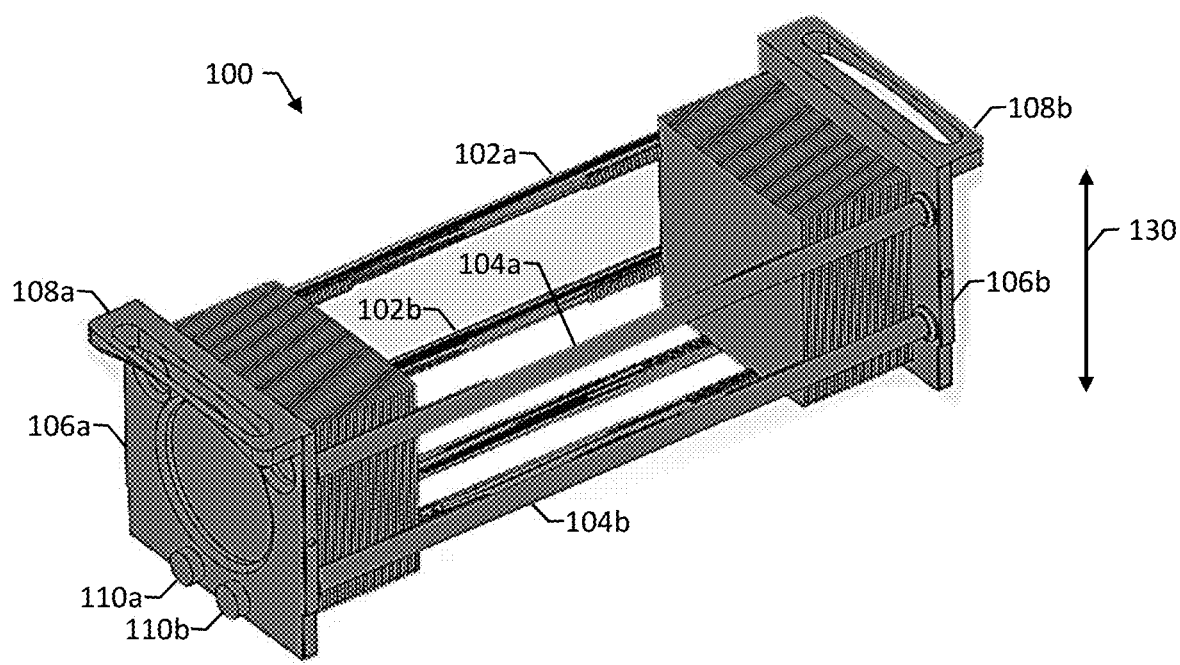
FIGS. 1A-B illustrate an example semiconductor wafer carrier.
Figure 1B:
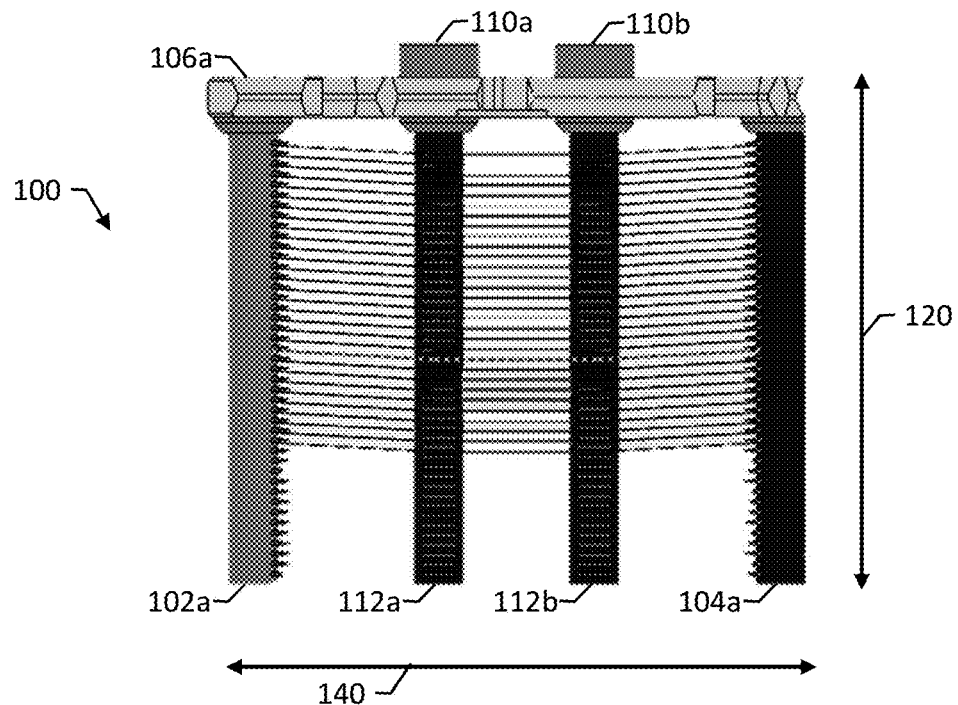

FIGS. 1A-B illustrate an example semiconductor wafer carrier 100. FIG. 1A shows an isometric view of the wafer carrier. FIG. 1B shows a top view of a portion of the wafer carrier 100.

The wafer carrier 100 includes upper and lower left-side rods 102a-b that are parallel in a vertical direction 130. The upper and lower left-side rods 102a-b each have a number of left-side notches. The left-side notches of the upper left-side rod 102a are vertically aligned with the left-side notches of the lower left-side rod 102b. The wafer carrier 100 also includes upper and lower right-side rods 104a-b that are parallel in the vertical direction 130 and have right-side notches that mirror the left-side notches.

Although the wafer carrier 100 is illustrated with upper and lower side rods, in some examples, the wafer carrier 100 has only a single left-side rod and a single right-side rod. Similarly, in some examples, the wafer carrier 100 has more than two side rods on each side that are parallel in the vertical direction 130.

The wafer carrier 100 includes left and right bottom rods 112a-b. Although two bottom rods are illustrated, the wafer carrier 100 can be implemented using only one bottom rod or more than two bottom rods. The left and right bottom rods 112a-b each have a number of bottom notches. The upper and lower left-side rods 102a-b, the upper and lower right-side rods 104a-b, and the bottom rods 112a-b are joined so that the left-side notches face the right-side notches and are horizontally aligned with the bottom-side notches. The notches define a number of semiconductor wafer slots between horizontally-aligned left-side notches, right-side notches, and bottom notches.

For example, each of the semiconductor wafer slots can have a height between the upper left-side and upper right-side rods 102a and 104a and the bottom rods 112a-b sized to receive a standard-conforming polycrystalline solar wafer, for example, a 5 inch or 6 inch wafer (e.g., having a diagonal width across the face of the wafer of 5 inches or 6 inches). Each of the semiconductor wafer slots can have a lateral length between the upper and lower left-side rods 102a-b and the upper and lower right-side rods 104a-b sized to receive the standard-conforming polycrystalline solar wafer.

The upper and lower left-side rods 102a-b, the upper and lower right-side rods 104a-b, and the bottom rods 114a-b may be formed of any appropriate material. Typically, the material is nonreactive two one or more semiconductor manufacturing processes, e.g., chemical processes. For example, the upper and lower left-side rods 102a-b, the upper and lower right-side rods 106a-b, and the bottom rods 110a-b may be formed of quartz or silicon carbide.

In some examples, the wafer carrier 100 includes front and back plates 106a-b. Each of the front and back plates 106a-b extends laterally (in a lateral direction 140) between the upper and lower left-side rods 102a-b and the upper and lower right-side rods 104a-b. The upper and lower left-side rods 102a-b and the upper and lower right-side rods 104a-b and the bottom rods 112a-b are joined by the front and back plates 120a-b to extend horizontally from the front plate 106a to the back plate 106b. The bottom rods 112a-b can be joined to the front and back plates 106a-b at respective hermetically-sealed moving joints.

The wafer carrier includes a mechanical rod-slider 110a-b coupled to the bottom rods 112a-b. The mechanical rod-slider is configured for sliding, in a horizontal direction 120, the bottom rods 112a-b relative to the left and right rods 102*a-b* and 104*a-b*. Since the semiconductor wafers are engaged with the notches on the left and right rods 102*a-b* and 104*a-b*, the sliding of the bottom rods 112*a-b* causes horizontal bowing of the semiconductor wafers loaded into the semiconductor wafer slots.

For example, the mechanical rod-slider 110*a-b* can be a rotatable knob coupled to a leadscrew. In another example, the mechanical rod-slider 110*a-b* can be a push-and-pull knob coupled to a linear motion stage, or an electrically-controlled linear actuator. If the wafer carrier 100 has more than one bottom rod, the mechanical rod-slider 110*a-b* can be configured to move all the rods together so that the wafer bows uniformly.

Bowing the wafers can be useful, e.g., to allow high density wafer loading even with wafers that are large and thin. Bowing the wafers can, in some cases, increase the throughput of some processing steps without increasing a physical foot print. In some examples, process parameters such as nozzle pressure and pump flowrate can be adjusted or increased without breaking wafers since the wafers are bowed. Bowing the wafers can reduce or eliminate cross-slotting and improve uniformity by improving position control.

In some examples, the wafer carrier 100 includes front and back transport interface handles 108*a-b*. The transport interface handles 108*a-b* can be detachably coupled to the front and back plates 106*a-b*. The transport interface handles 108*a-b* can used, e.g., so that an automation system can lift and move the wafer carrier 100.

Figure 2A:
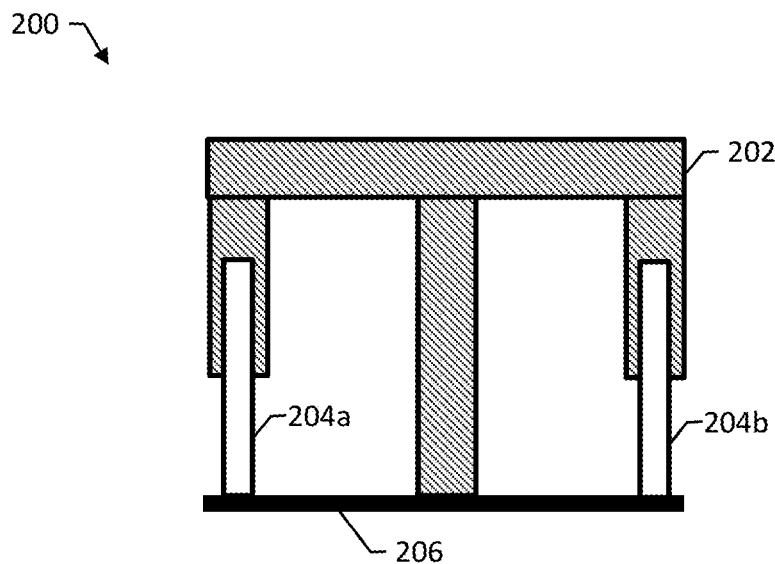
FIGS. 2A-B illustrate a portion of an example automation system for bowing semiconductor wafers prior to loading the wafers into a wafer carrier.
Figure 2B:
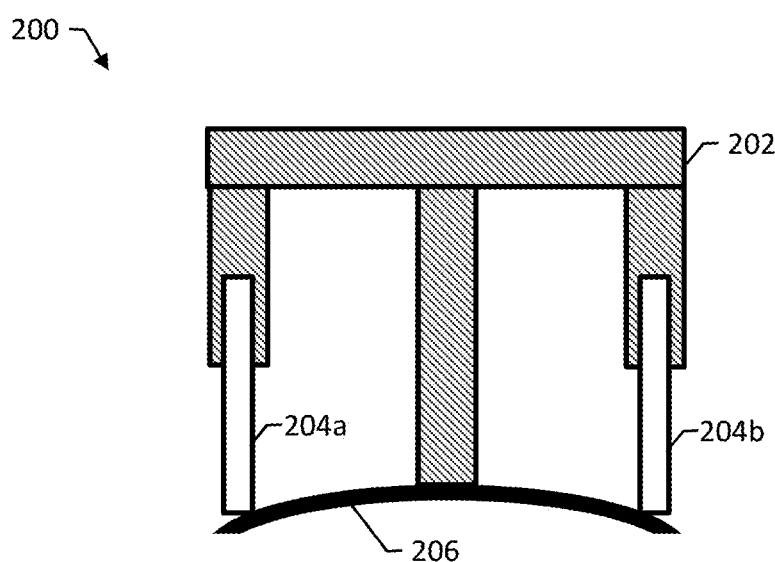

FIGS. 2A-B illustrate a portion of an example automation system 200 for bowing semiconductor wafers prior to loading the wafers into a wafer carrier. The automation system 200 is implemented using robotic components and can be controlled, e.g., by a computer system programmed for loading and processing semiconductor wafers. In general, any appropriate robotic system can be used for bowing the wafers, and the automation system 200 shown in FIGS. 2A-B is provided for purposes of illustration.

The automation system 200 includes a robotic gripper 202 having left and right pistons 204*a-b*. The robotic gripper 202 is configured to grip a semiconductor wafer 206 and hold the center of the wafer 206 in place. The left and right pistons 204*a-b* are configured to engage the left and right sides of the wafer 206 and push the wafer 206 to bow without breaking the wafer 206. FIG. 2A shows the robotic gripper 202 holding the wafer 206 prior to bowing the wafer 206. FIG. 2B shows the pistons 204*a-b* causing the wafer 206 to horizontally bow.

Figure 3A:
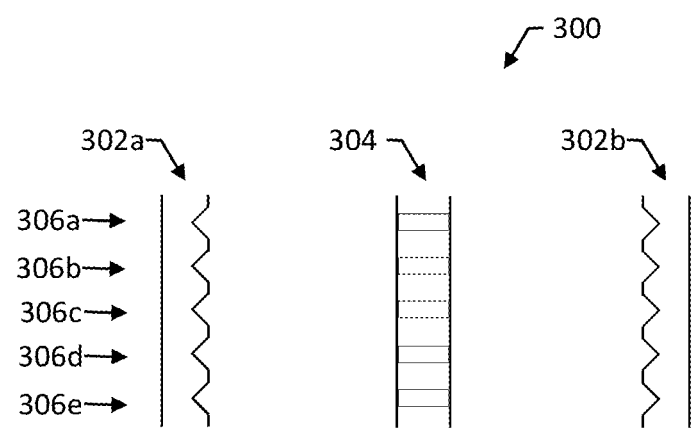
FIGS. 3A-F illustrate loading of a horizontally-bowed semiconductor wafer into an example wafer carrier.
Figure 3B:
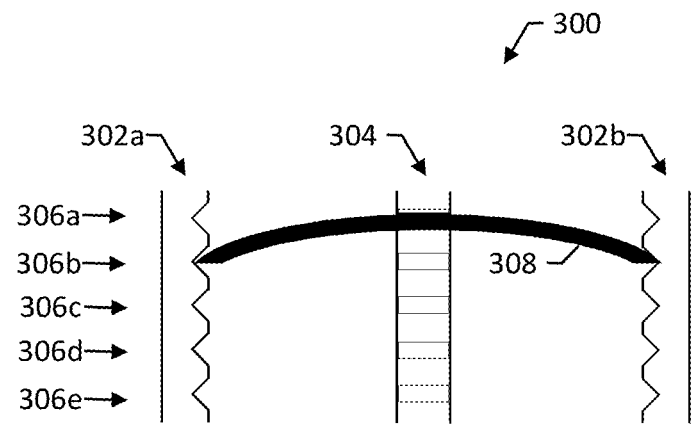
Figure 3C:
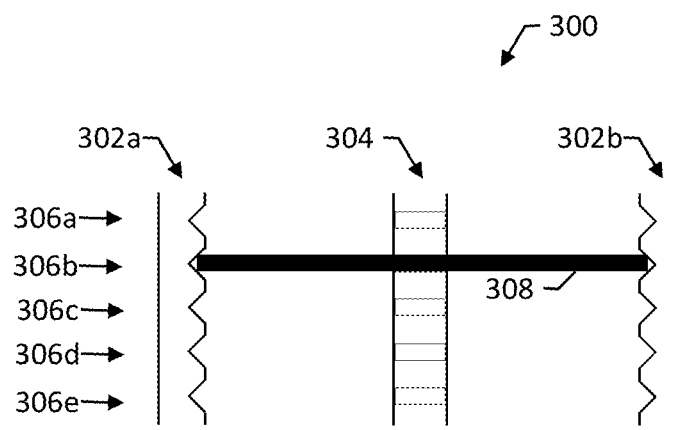
Figure 3D:
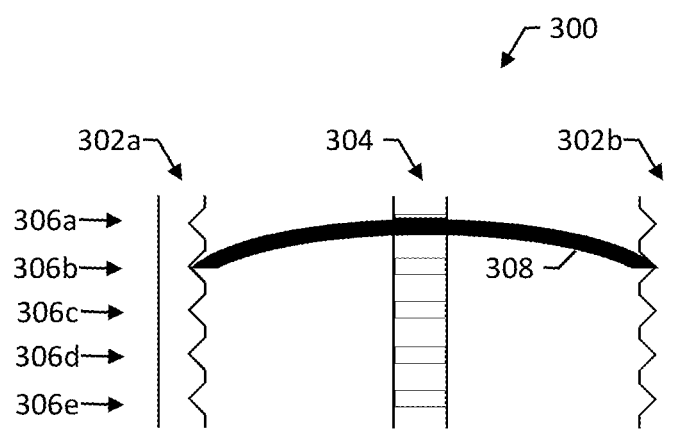

FIGS. 3A-F illustrate loading of a horizontally-bowed semiconductor wafer 308 into an example wafer carrier 300. The wafer carrier 300 includes a left-side rod 302*a*, a right-side rod 302*b*, and a bottom rod 304. FIGS. 3A-B illustrate pre-bowing the semiconductor wafer 308 prior to loading, and FIGS. 3C-D illustrate partially loading the semiconductor wafer 308 before bowing the semiconductor wafer 308 and then fully loading the horizontally-bowed semiconductor wafer 308.

FIG. 3A is a top view of the wafer carrier 300 prior to loading of the horizontally-bowed wafer 308 shown in FIG. 3B. The illustrated portion of the wafer carrier 300 has five wafer slots 306*a-e* each comprising horizontally aligned notches in the left and right rods 302*a-b* and the bottom rod 304.

FIG. 3B is a top view of the wafer carrier 300 after loading the horizontally-bowed wafer 308. Since the wafer 308 is bowed, the center of the wafer 308 engages the bottom rod 304 in the first wafer slot 306*a* and the right and left sides of the wafer 308 engage the right and left rods 302*a-b* in the second wafer slot 306*b*. For example, the left and right sides of the wafer 308 may be horizontally offset from the center of the wafer 308 by a horizontal distance of about 8 mm, or any appropriate distance that increases the rigidity of the wafer 308 without breaking the wafer 308.

Accordingly, the bottom notch is horizontally offset from the left and right notches, and the wafer carrier 300 keeps the wafer 308 horizontally bowed after the wafer 308 has been bowed and loaded by an automation system such as the example automation system 200 of FIGS. 2A-B. As illustrated, the bottom notch is only offset by one position; however, depending on the distance that the wafer is bowed, the bottom notch may be offset by more than one position from the left and right notches.

Figure 3E:
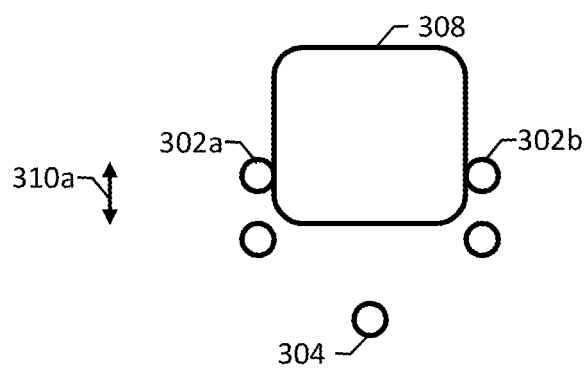

FIG. 3C is a top view of the wafer carrier 300 where the wafer 308 has been partially inserted. The wafer 308 has been inserted in the wafer carrier 300 to a first depth so that the right and left sides of the wafer 308 engage the right and left rods 302*a-b* in the second wafer slot 306*b*, but the bottom of the wafer 308 has not yet engaged the bottom rod 304. FIG. 3E is a front view of the wafer carrier 300 where the wafer 308 has been partially inserted to the first depth 310*a*.

Figure 3F:
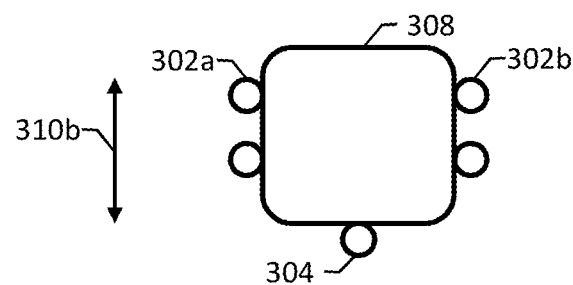

FIG. 3D is a top view of the wafer carrier 300 after the wafer 308 has been horizontally bowed and fully inserted to a second depth, deeper than the first depth, so that the bottom of the wafer 308 engages the bottom rod 304 in a bottom notch horizontally offset from the second wafer slot 306*b*, i.e., the bottom notch for the first wafer slot 306*a*. FIG. 3F is a front view of the wafer carrier 300 where the wafer 308 has been fully inserted to the second depth 310*b*.

Figure 4:
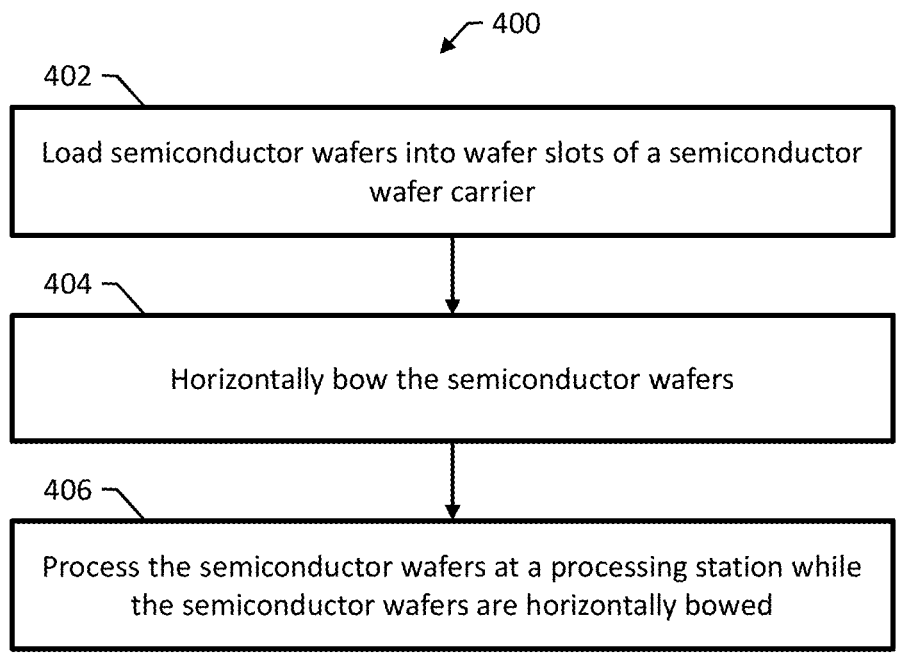
FIG. 4 is a flow diagram of an example method for processing semiconductor wafers.

FIG. 4 is a flow diagram of an example method 400 for processing semiconductor wafers. The method 400 can be performed, e.g., by an automation system for processing semiconductor wafers, or by an automation system acting together with one or more human operators.

The method 400 includes loading each semiconductor wafer into a respective semiconductor wafer slot of a semiconductor wafer carrier (402). The wafer carrier can be, e.g., the wafer carrier 100 of FIGS. 1A and 1B. The method 400 includes horizontally bowing each semiconductor wafer (404). For example, horizontally bowing the wafers can include sliding, in the horizontal direction, one or more bottom rods relative to the left and right rods. The method 400 includes moving the semiconductor wafer carrier into a processing station and processing the semiconductor wafers at the processing station while the semiconductor wafers are loaded into the semiconductor wafer carrier and horizontally bowed (406).

Figure 5:
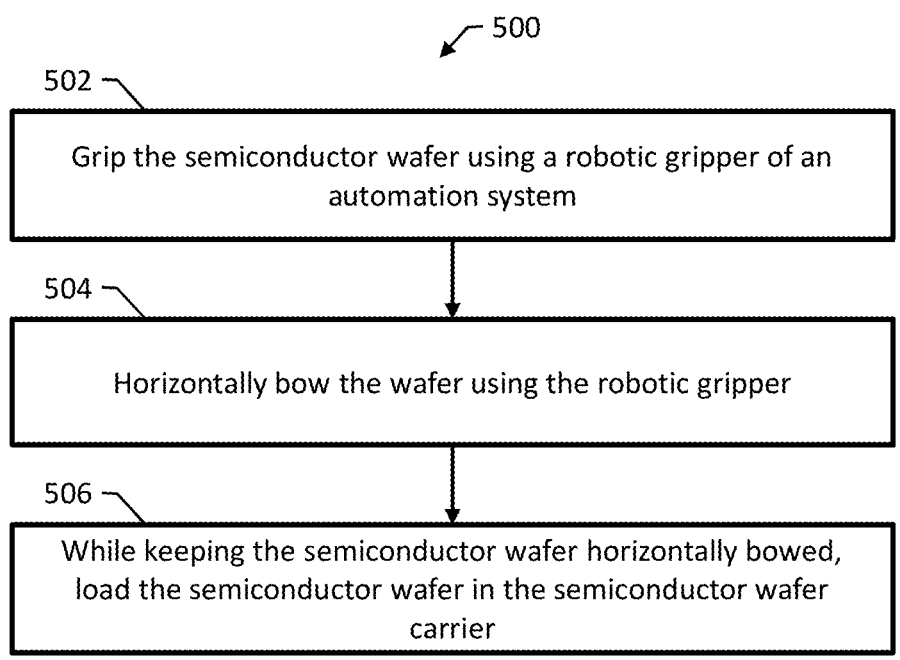
FIG. 5 is a flow diagram of an example method for loading semiconductor wafers into a semiconductor wafer carrier.

FIG. 5 is a flow diagram of an example method 500 for loading semiconductor wafers into a semiconductor wafer carrier. The method 500 can be performed, e.g., by an automation system for processing semiconductor wafers, or by an automation system acting together with one or more human operators. The wafer carrier can be, e.g., the wafer carrier 300 of FIGS. 3A-B.

The method 500 includes, for each wafer, gripping the wafer using a robotic gripper of an automation system (502). For example, the automation system can be the automation system 200 of FIGS. 2A-B. The method 500 includes, for each wafer, horizontally bowing the wafer using gripper (504). The method 500 includes, for each wafer and while keeping the wafer horizontally bowed, loading the wafer in the semiconductor wafer carrier (506). The wafer sits in horizontally aligned left and right notches in left and right rods of the semiconductor wafer carrier. Due to the horizontal bowing, the wafer sits in at least one bottom notch in a bottom rod that is horizontally offset from the left and right notches in the left and right rods.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A method for processing semiconductor wafers, the method comprising:
    loading a semiconductor wafer into a semiconductor wafer slot of a semiconductor wafer carrier;
    bowing the semiconductor wafer loaded into the semiconductor wafer slot such that the semiconductor wafer remains bowed after being loaded into the semiconductor wafer slot, wherein bowing the semiconductor wafer loaded into the semiconductor wafer slot comprises offsetting a center portion of the semiconductor wafer from one or more side portions of the semiconductor wafer carrier; and
    processing the semiconductor wafer at a semiconductor processing station through one or more semiconductor processing stages while the semiconductor wafer is loaded and bowed in the semiconductor wafer carrier slot.

2. The method of claim 1, wherein bowing the semiconductor wafer loaded into the semiconductor wafer slot comprises sliding one or more bottom portions of the semiconductor wafer carrier relative to one or more side portions of the semiconductor wafer carrier.

3. The method of claim 1, wherein bowing the semiconductor wafer loaded into the semiconductor wafer slot comprises rotating a rotatable knob coupled to one or more bottom portions of the semiconductor wafer carrier.

4. The method of claim 1, wherein bowing the semiconductor wafer loaded into the semiconductor wafer slot comprises pushing or pulling on one or more bottom portions of the semiconductor wafer carrier relative to one or more side portions of the semiconductor wafer carrier.

5. The method of claim 1, wherein bowing the semiconductor wafer loaded into the semiconductor wafer slot comprises activating an electrically-controlled linear actuator coupled to one or more bottom portions of the semiconductor wafer carrier.

6. The method of claim 1, wherein loading the semiconductor wafer into a semiconductor wafer slot comprises engaging a center portion of the semiconductor wafer to a bottom portion of the semiconductor wafer carrier and engaging one or more side portions of the semiconductor wafer to one or more side portions of the semiconductor wafer carrier.

7. A method for processing semiconductor wafers, the method comprising:
    loading a semiconductor wafer into a semiconductor wafer slot of a semiconductor wafer carrier;
    bowing the semiconductor wafer loaded into the semiconductor wafer slot such that the semiconductor wafer remains bowed after being loaded into the semiconductor wafer slot, wherein bowing the semiconductor wafer loaded into the semiconductor wafer slot comprises sliding one or more portions of the semiconductor wafer carrier; and
    processing the semiconductor wafer at a semiconductor processing station through one or more semiconductor processing stages while the semiconductor wafer is loaded and bowed in the semiconductor wafer carrier slot.

8. The method of claim 7, wherein bowing the semiconductor wafer loaded into the semiconductor wafer slot comprises sliding one or more first portions of the semiconductor wafer carrier relative to one or more second portions of the semiconductor wafer carrier.

9. The method of claim 7, wherein bowing the semiconductor wafer loaded into the semiconductor wafer slot comprises offsetting a portion of the semiconductor wafer.

10. The method of claim 7, wherein bowing the semiconductor wafer loaded into the semiconductor wafer slot comprises offsetting a first portion of the semiconductor wafer from one or more second portions of the semiconductor wafer carrier.

11. The method of claim 7, wherein bowing the semiconductor wafer loaded into the semiconductor wafer slot comprises rotating a rotatable knob coupled to one or more portions of the semiconductor wafer carrier.

12. The method of claim 7, wherein bowing the semiconductor wafer loaded into the semiconductor wafer slot comprises pushing or pulling on one or more first portions of the semiconductor wafer carrier relative to one or more second portions of the semiconductor wafer carrier.

13. The method of claim 7, wherein bowing the semiconductor wafer loaded into the semiconductor wafer slot comprises activating an actuator coupled to one or more portions of the semiconductor wafer carrier.

14. The method of claim 7, wherein bowing the semiconductor wafer loaded into the semiconductor wafer slot comprises activating an electrically-controlled linear actuator.

15. The method of claim 7, wherein loading the semiconductor wafer into a semiconductor wafer slot comprises engaging a center portion of the semiconductor wafer to a first portion of the semiconductor wafer carrier.

16. The method of claim 7, wherein loading the semiconductor wafer into a semiconductor wafer slot comprises engaging one or more first portions of the semiconductor wafer to one or more second portions of the semiconductor wafer carrier.

17. A method for processing semiconductor wafers, the method comprising:
    loading a semiconductor wafer into a semiconductor wafer slot of a semiconductor wafer carrier;
    bowing the semiconductor wafer loaded into the semiconductor wafer slot such that the semiconductor wafer remains bowed after being loaded into the semiconductor wafer slot, wherein bowing the semiconductor wafer loaded into the semiconductor wafer slot comprises rotating a rotatable knob coupled to one or more bottom portions of the semiconductor wafer carrier; and processing the semiconductor wafer at a semiconductor processing station through one or more semiconductor processing stages while the semiconductor wafer is loaded and bowed in the semiconductor wafer carrier slot.

18. The method of claim 17, wherein bowing the semiconductor wafer loaded into the semiconductor wafer slot comprises sliding one or more bottom portions of the semiconductor wafer carrier relative to one or more side portions of the semiconductor wafer carrier.

19. The method of claim 17, wherein bowing the semiconductor wafer loaded into the semiconductor wafer slot comprises pushing or pulling on one or more bottom portions of the semiconductor wafer carrier relative to one or more side portions of the semiconductor wafer carrier.

20. The method of claim 17, wherein bowing the semiconductor wafer loaded into the semiconductor wafer slot comprises activating an electrically-controlled linear actuator coupled to one or more bottom portions of the semiconductor wafer carrier.

* * * * *